United States Patent [19]

Konuma et al.

[11] Patent Number: 5,595,638
[45] Date of Patent: Jan. 21, 1997

[54] METHOD FOR MANUFACTURING A SEMICONDUCTOR DEVICE UTILIZING AN ANODIC OXIDATION

[75] Inventors: Toshimitsu Konuma; Akira Sugawara; Yukiko Uehara, all of Kanagawa, Japan

[73] Assignee: Semiconductor Energy Laboratory Co., Ltd., Atsugi, Japan

[21] Appl. No.: 401,698

[22] Filed: Mar. 10, 1995

[30] Foreign Application Priority Data

Mar. 17, 1994 [JP] Japan .................................. 6-074024

[51] Int. Cl.$^6$ .............................. C25D 5/00; C25D 5/18; C25D 11/00; C25D 5/48
[52] U.S. Cl. .......................... 205/96; 205/106; 205/107; 205/108; 205/124; 205/229; 205/316; 205/324
[58] Field of Search .......................... 205/96, 106, 229, 205/316, 324, 107, 108, 124

[56] References Cited

U.S. PATENT DOCUMENTS

| 2,918,416 | 12/1959 | Taylor | 205/106 |
| 3,020,219 | 2/1962 | Franklin et al. | 205/106 |

FOREIGN PATENT DOCUMENTS

496356  1/1957  Italy.

Primary Examiner—Donald R. Valentine
Assistant Examiner—Edna Wong
Attorney, Agent, or Firm—Sixbey, Friedman, Leedom & Ferguson, PC; Gerald J. Ferguson, Jr.; Eric J. Robinson

[57] ABSTRACT

An anodic oxide containing impurities at a low concentration and thereby improved in film quality, and a process for fabricating the same. The process comprises increasing the current between a metallic thin film and a cathode until a voltage therebetween reaches a predetermined value, and maintaining the voltage at the predetermined value thereafter.

10 Claims, 11 Drawing Sheets

METHOD FOR MANUFACTURING A SEMICONDUCTOR DEVICE UTILIZING AN ANODIC OXIDATION

BACKGROUND OF THE INVENTION

1. Field of the Invention

The present invention relates to an anodic oxide and a process of anodic oxidation. In particular, the present invention relates to a process for anodically oxidizing electrodes and interconnections of semiconductor devices.

2. Prior Art

To prevent current leakage and short circuit from occurring in a semiconductor device, in general, a high-resistance anodic oxide is formed as an insulator by anodically oxidizing the surface of the metallic constituents such as electrodes, interconnections, etc., of the semiconductor device.

The characteristics of an anodic oxide depend on the electrolytic solution that is used in the anodic oxidation. In particular, in the case that a neutral electrolytic solution is used as the solution for the anodic oxidation, a dense and pinhole-free composition known as barrier-type oxide can be obtained. This anodic oxide is therefore advantageous, and is frequently used as an insulator to separate electrodes and interconnections.

In a prior art process of anodic oxidation, an anode of a direct current (DC) power source is connected to a metallic (e.g., aluminum, tantalum, titanium, or silicon) interconnection formed on a substrate while connecting a cathode made of platinum and the like to the cathode of the DC power source, and applying a DC voltage between the metallic interconnections and the cathode while immersing them into the anodically oxidizing solution. In general, the current and the voltage applied between the anode and the cathode are varied in the following manner.

Figure 1:
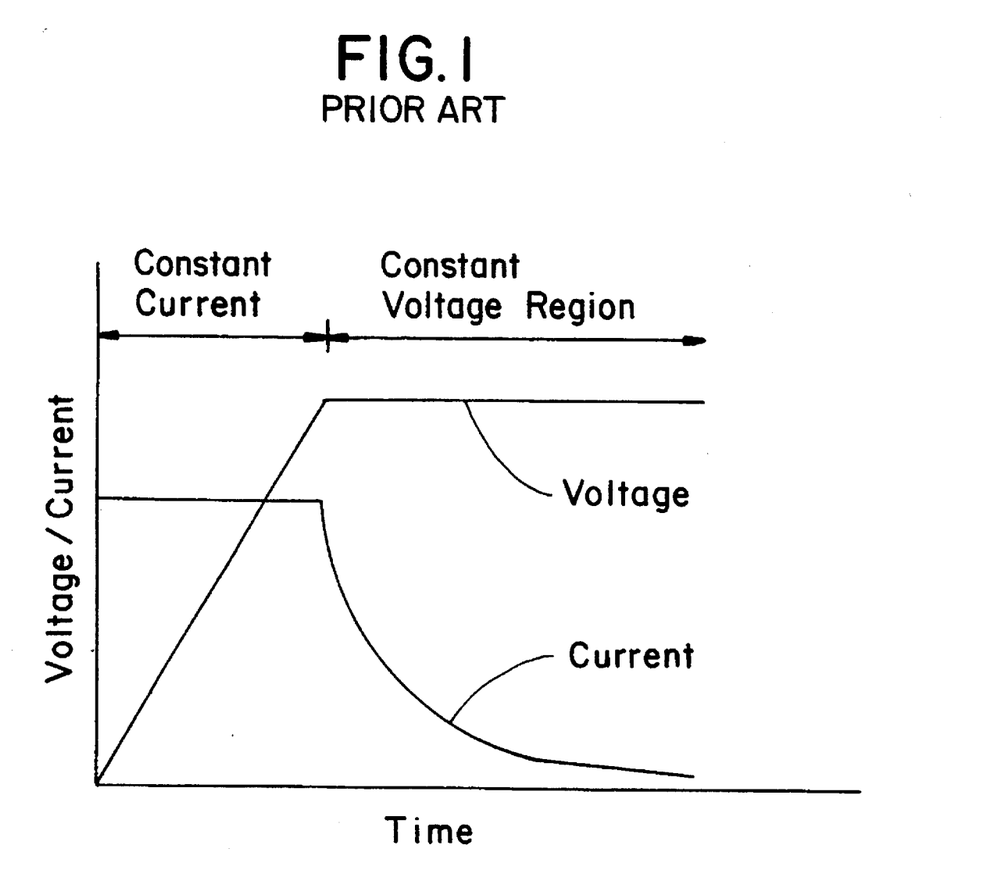
FIG. 1 shows a relation between current and voltage applied in a prior art process of anodic oxidation.

Referring to FIG. 1, conventionally, the current is first maintained at a constant value for a certain period of time (constant-current mode). In this mode, the resistance of the metallic interconnection increases as the anodic oxide film formed on the metallic interconnection becomes thicker, thereby gradually increasing the voltage.

Upon reaching a predetermined value of voltage, the method for controlling the process is switched to realize a constant voltage mode in which the current flow is decreased by maintaining the voltage at a constant value. The voltage is maintained constant for a duration of several to several tens of minutes to complete the process of anodic oxidation.

In the aforementioned process of anodic oxidation, the film thickness of the anodic oxide can be controlled by changing the voltage. That is, because the anodic oxide has high resistivity, the voltage in the constant-current state increases proportional to the film thickness of the anodic oxide being formed throughout the anodic oxidation process.

However, the oxide film thus obtained is not sufficiently uniform in terms of film thickness and quality. Then, in order to improve the quality of the film, the oxidation is further continued while maintaining the voltage at a constant value. The current flow then decreases as to finally attain a value equivalent to about one tenth of the current maintained through the constant-current state.

However, when the anodic oxide film formed in the above manner is used on a gate electrode of an insulated gate field effect transistor, there have been observed some problems as discussed below.

(1) The Generation of a Parasitic Electric Field in the Gate Portion

Many thin film transistors fabricated by a prior art process were found to generate an electric field inside the transistor even when no electric field is applied thereto. Since an internal electric field, i.e. a parasitic electric field, is not only an obstacle in realizing a low off-current, but also a cause for the characteristics shift on conducting BT (bias voltage-thermal) treatment.

With an aim to clarify the above phenomenon, the present inventors presumed that the foregoing phenomena is attributed to the impurities incorporated into the anodic oxide coating of the gate portion. From this point of view, the present inventors conducted chemical analyses of the anodically oxidized metallic interconnection and found a mixed region of a metal and an oxide at the interface between the metal and the oxide film formed on the surface thereof.

Figure 2:
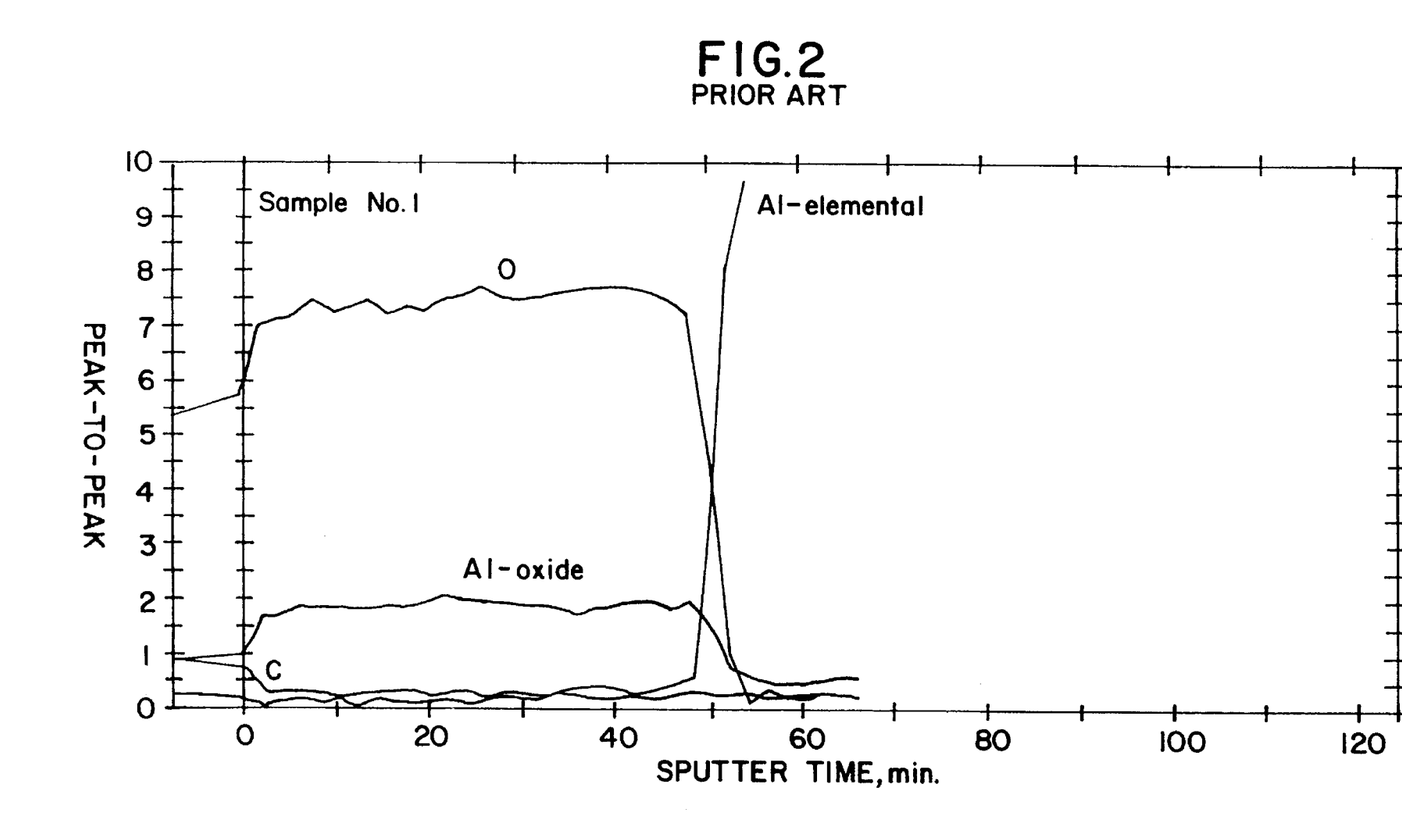
FIG. 2 shows a chemical composition profile obtained by Auger electron spectroscopy (AES) of an aluminum interconnection anodically oxidized in accordance with a prior art process.
Figure 3:
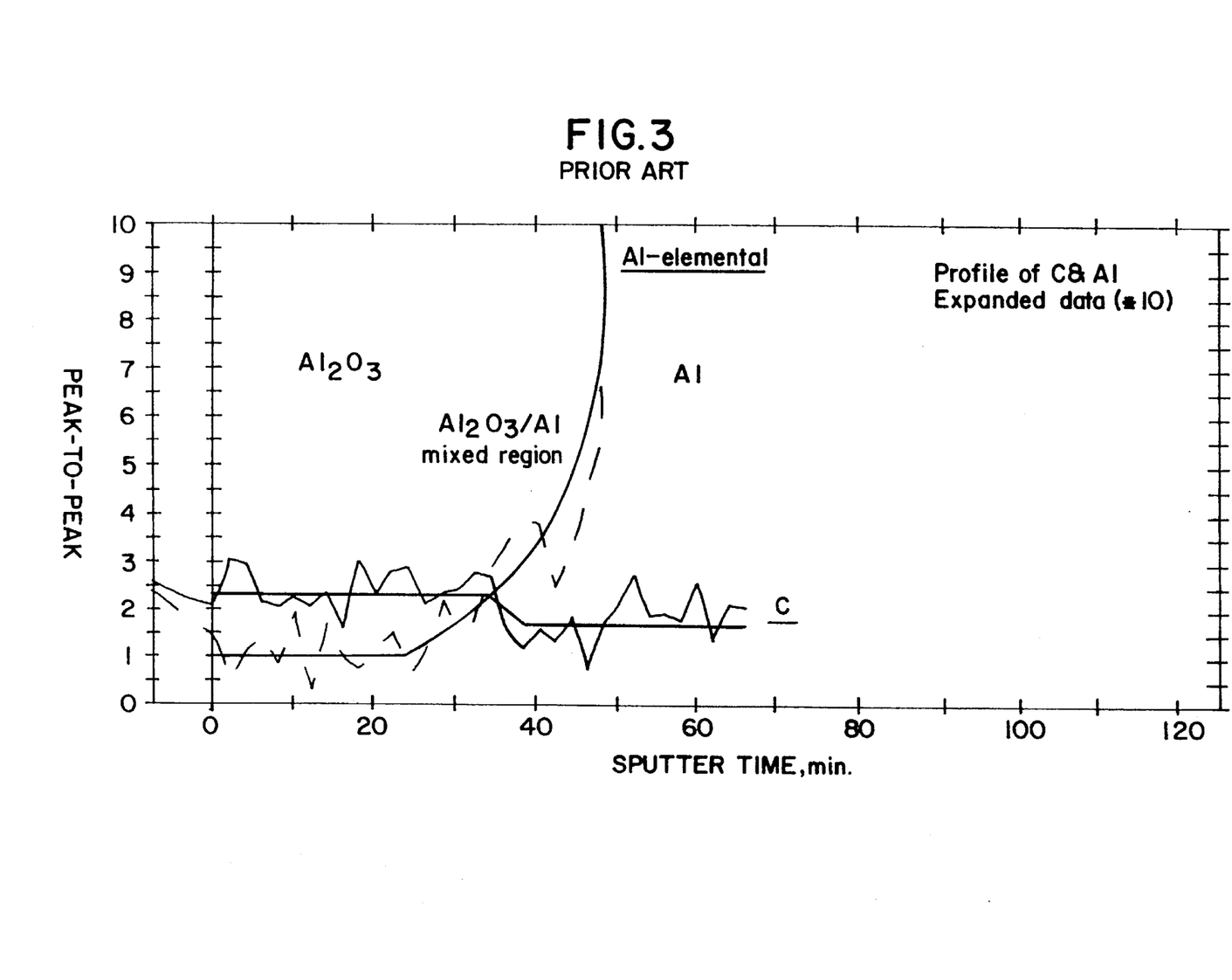
FIG. 3 shows an enlarged diagram of a chemical composition profile obtained by AES of an aluminum interconnection anodically oxidized in accordance with a prior art process.

In FIG. 2, there is shown an example of the chemical composition obtained by Auger electron spectroscopy (AES) for an anodically oxidized aluminum interconnection fabricated by a conventional process. FIG. 3 is a graph corresponding to that of FIG. 2, in which the ordinate is enlarged.

In both graphs shown in FIGS. 2 and 3, the ordinate represents the signal intensity of the substance, and the abscissa represents the time duration of sputtering in the depth direction. The anodically oxidized aluminum film is obtained by increasing the voltage at a rate of 1 V/min in a constant-current mode until a voltage of 100 V is attained, and then switching the operation mode to that of a constant-voltage stage to maintain the voltage at 100 V for a duration of 30 minutes. An ethylene glycol solution containing from 3 to 10% of tartaric acid and neutralized (i.e., pH adjusted approximately to a value of 7) with ammonia water was used as the solution for anodic oxidation.

As shown in FIG. 3, the boundary between aluminum oxide ($Al_2O_3$) and aluminum (Al) is not clear, but three regions can be distinguished. Specifically, a region of external layer consisting mainly of aluminum oxide, a mixed region of internal layer containing both aluminum oxide and aluminum, and a region of non-oxidized aluminum can be observed.

Another distinct feature in FIG. 3 is that, as compared with the region of internal layer of aluminum, the region of external layer mainly consisting of aluminum oxide contains, although in a trace amount, carbon (C). This suggests that the anodically oxidized aluminum oxide takes up carbon from the solution used for the anodic oxidation.

Conclusively, the aluminum and carbon that are present inside the aluminum oxide function as impurities to generate either positive or negative parasitic charges. The parasitic electric field in the gate portion is formed in this manner.

(2) Duration of Anodic Oxidation

Another problem is the excessively long time consumed in the formation of a barrier-type anodic oxide. Typically, the anodic oxidation takes 120 minutes or even longer to complete the process. It has been therefore desired to develop a more rapid process for forming an anodic oxide film.

SUMMARY OF THE INVENTION

An object of the present invention is to provide an anodic oxide film free of impurities and thereby improved in film quality.

Another object of the present invention is to lower the off-current in a thin film transistor (TFT) by suppressing the formation of a parasitic electric field.

A further object of the present invention is to provide a rapid process of anodic oxidation.

A still further object of the present invention is to make a sharp (clear) interface between an anodic oxide coating and a metal.

According to one aspect of the invention, there is provided an anodic oxide formed by anodically oxidizing a metal and which comprises a surface layer and an inner layer, the surface layer containing carbon atoms at a lower concentration than the inner layer, and the inner layer containing a mixture of the metal and an anodic oxide thereof at a lower concentration than the surface layer.

According to another aspect of the present invention, there is provided a process of anodic oxidation comprising applying a direct current between a metallic thin film formed on a substrate as an anode and a cathode that are electrically connected with each other via a solution for anodic oxidation, said process comprising:

increasing monotonically the current applied between the metallic thin film and the anode until a voltage therebetween reaches a predetermined value; and maintaining the voltage after the predetermined value is attained.

In accordance with another aspect of the present invention, there is provided a process of anodic oxidation comprising applying a direct current between a metallic thin film formed on a substrate as an anode and a cathode that are electrically connected with each other via a solution for anodic oxidation, said process comprising:

maintaining the current applied between the metallic thin film and the anode at a constant value until a predetermined voltage between the metallic thin film and the cathode is attained; and increasing the voltage at a constant rate after the predetermined voltage is attained.

BRIEF DESCRIPTION OF THE DRAWINGS

FIGS. 4 (A) and 4 (B) each shows a relation between current and voltage applied in a process of anodic oxidation according to the present invention;

FIGS. 9 (A) to 9 (E) are diagrams showing a manufacturing process of a thin film transistor (TFT) circuit according to a second embodiment of the present invention;

FIGS. 10 (A) to 10 (C) are diagrams showing a manufacturing process of a thin film transistor (TFT) circuit according to a second embodiment of the present invention; and FIGS. 11 (A) to 11 (D) are diagrams showing a manufacturing process of a thin film transistor(TFT) circuit according to a third embodiment of the present invention.

DETAILED DESCRIPTION OF THE INVENTION

(1) Al Impurities Within Oxide

In contrast to a prior art process of anodic oxidation comprising transferring operation modes from a constant-current mode to a constant-voltage mode, the operation of the process according to the present invention comprises either (1) transferring from a stage of increasing current flow to a constant-voltage mode, or (2) transferring from a constant-current stage to a stage of increasing voltage.

Figure 4A:
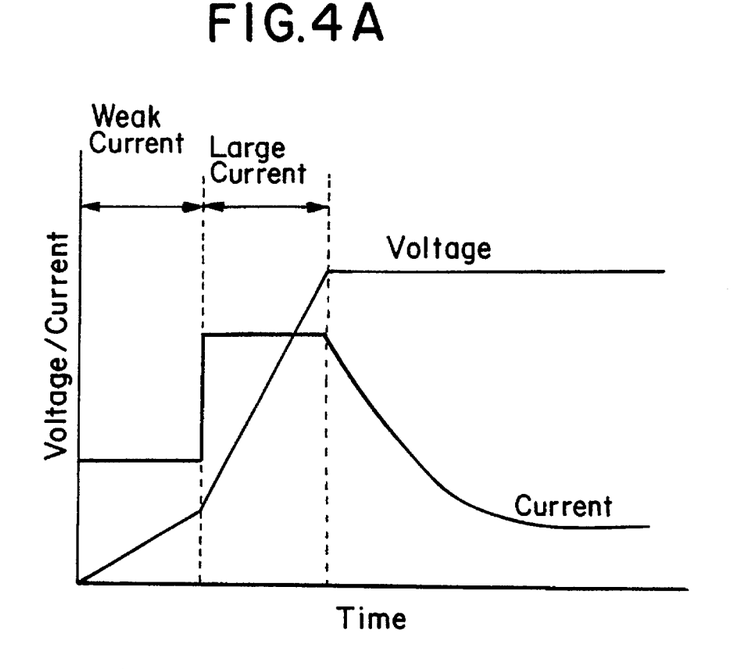
Figure 4B:
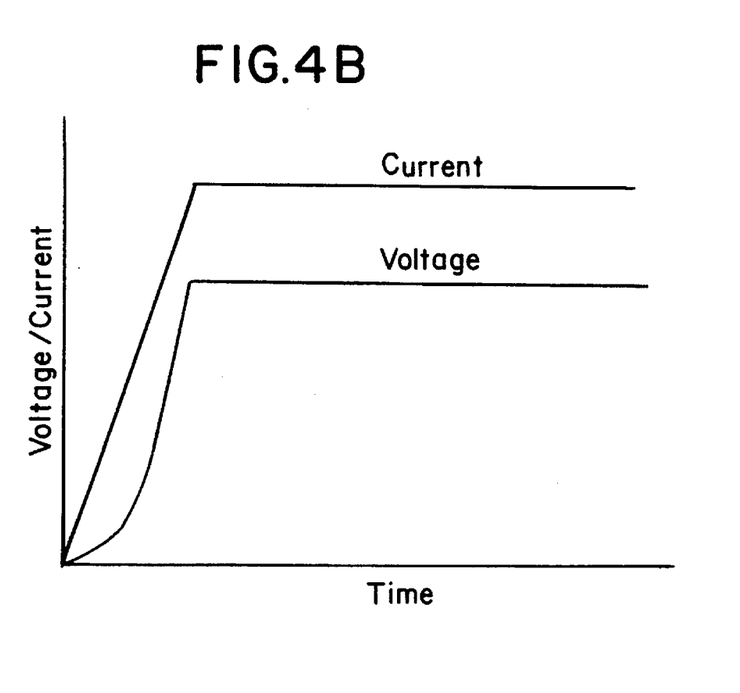

Referring to FIG. 4 (A), the current is increased in two steps from the initial current density in a range of 0.01 to 0.1 mA/cm$^2$ to a range of 0.2 to 5 mA/cm$^2$. Of course, the number of steps in this increase may be increased. In the alternative, referring to FIG. 4 (B), the current flow can be increased continuously. According to the study of the present inventors, the film quality of the anodic oxide can be modified effectively by changing the current flow in either ways.

Figure 5:
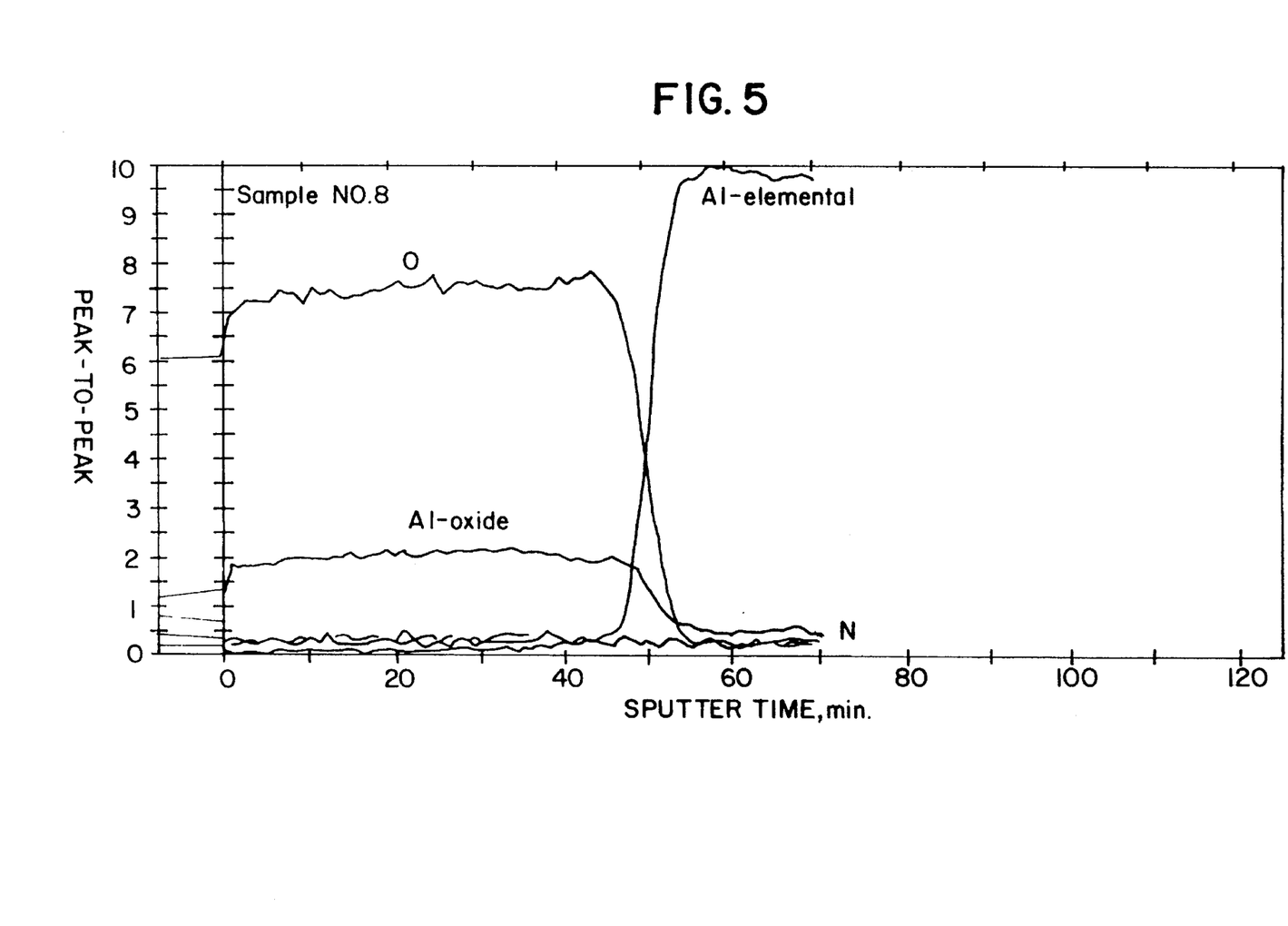
FIG. 5 shows a chemical composition profile obtained by AES of an aluminum interconnection anodically oxidized in accordance with the present invention.
Figure 6:
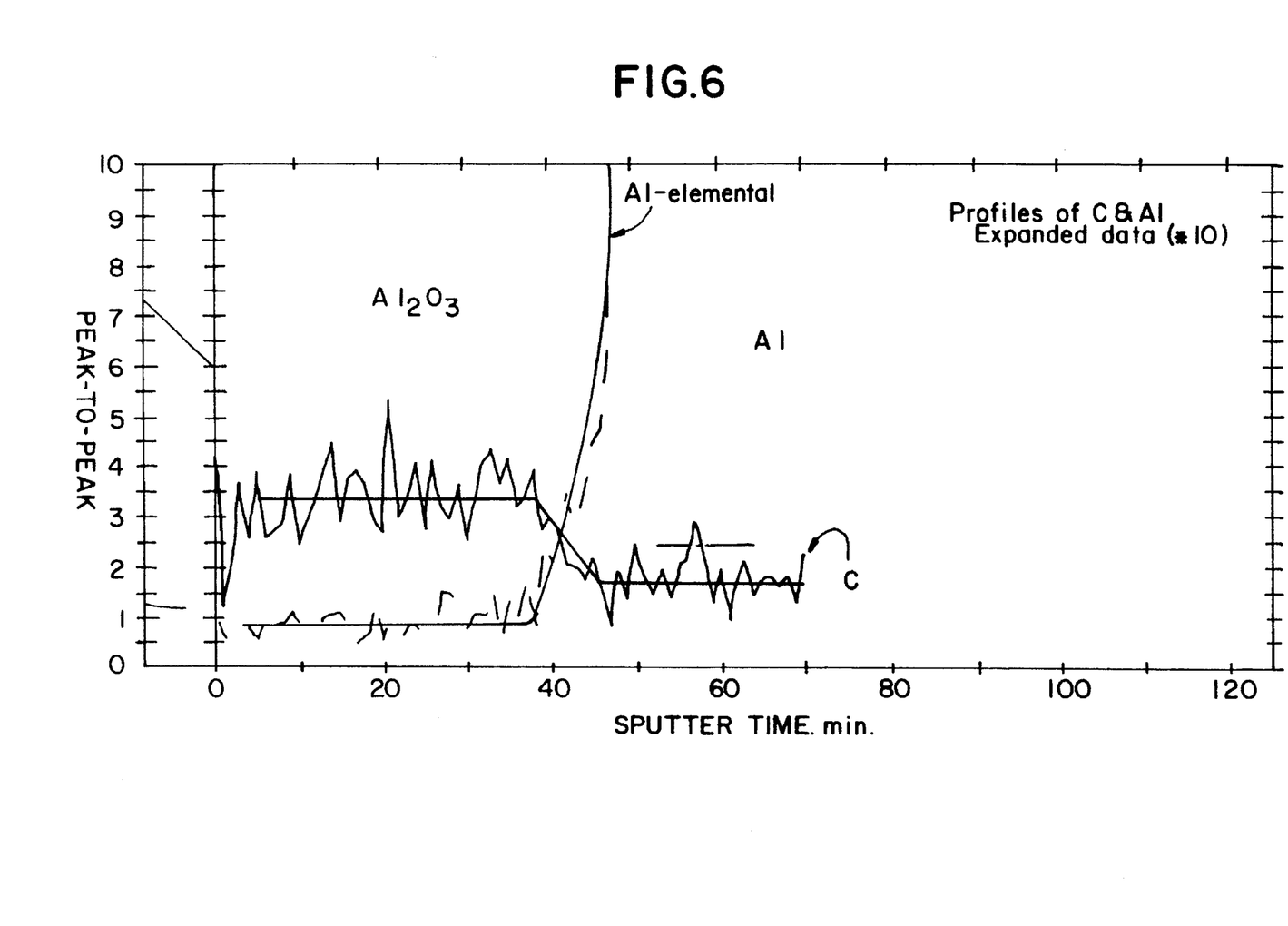
FIG. 6 shows an enlarged diagram of a chemical composition profile obtained by AES of an aluminum interconnection anodically oxidized in accordance with the present invention.

FIG. 5 shows the composition of an anodically oxidized aluminum film determined by Auger electron spectroscopy (AES). The anodically oxidized aluminum film was formed by applying current while controlling the density thereof to increase at a rate of 5 mA/cm$^2$ per minute, and a minute later, after the voltage between the electrodes attains a value of 100 V, the operation was switched to a constant-voltage mode to maintain the voltage for a duration of 30 minutes. FIG. 6 shows a composition profile obtained by enlarging the profile of FIG. 5 along the ordinate.

In FIG. 6, the ordinate represents the signal intensity of the substance, and the abscissa represents the time duration of sputtering in the depth direction. An ethylene glycol solution containing 3 to 10% of tartaric acid and neutralized (i.e., pH adjusted approximately to a value of 7) with ammonia water was used as the solution for anodic oxidation.

Referring to FIG. 6, as compared with a case of an anodically oxidized aluminum obtained by a conventional process (FIG. 3), the mixed region of internal layer containing both aluminum oxide and aluminum accounts for far less of the anodically oxidized aluminum obtained by a process according to the present invention. It can be seen that the carbon content in the anodically oxidized aluminum film obtained by the present invention is increased as compared with that illustrated in FIG. 1.

Figure 7:
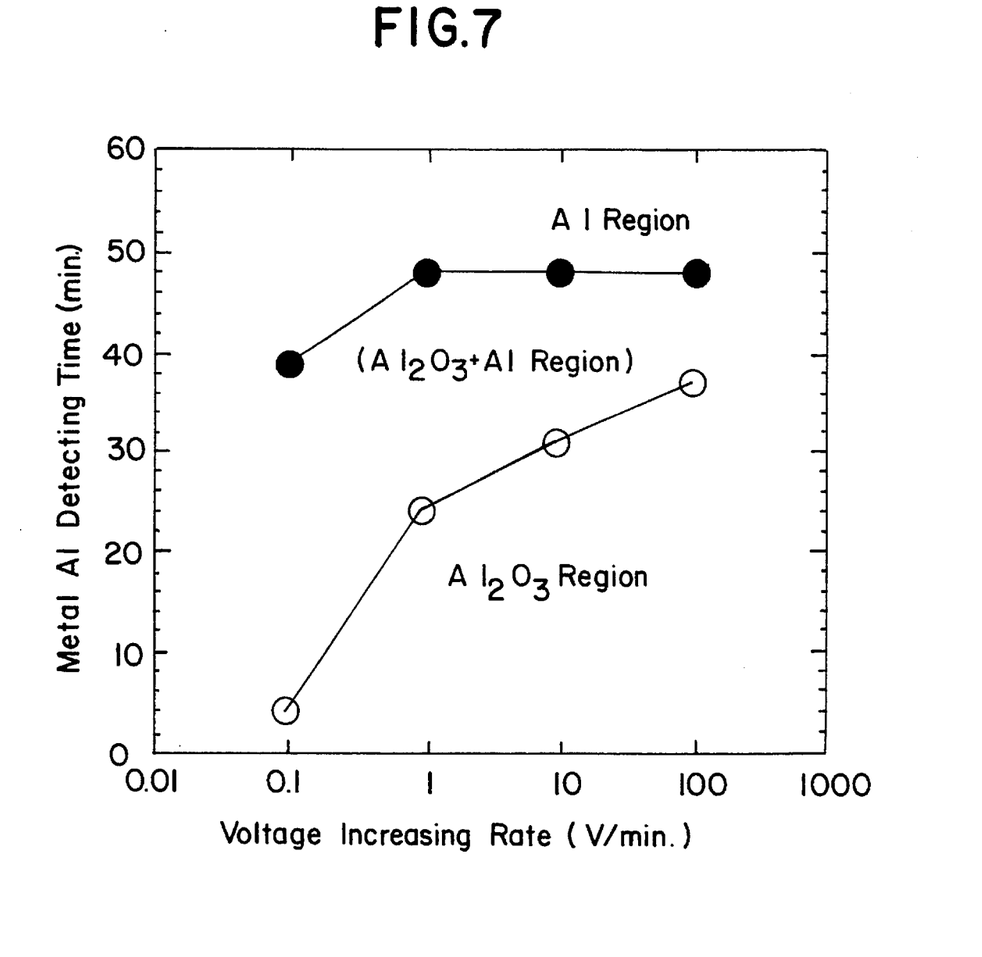
FIG. 7 is a diagram showing the depth profile for aluminum obtained by AES with changing rate of increasing voltage.

The results obtained by the depth analysis of aluminum using AES with changing rate of elevating the voltage are shown in FIG. 7. The figure clearly indicates that the area of the mixed region of internal layer containing both aluminum oxide and aluminum decreases with increasing rate of elevating the voltage.

Figure 8:
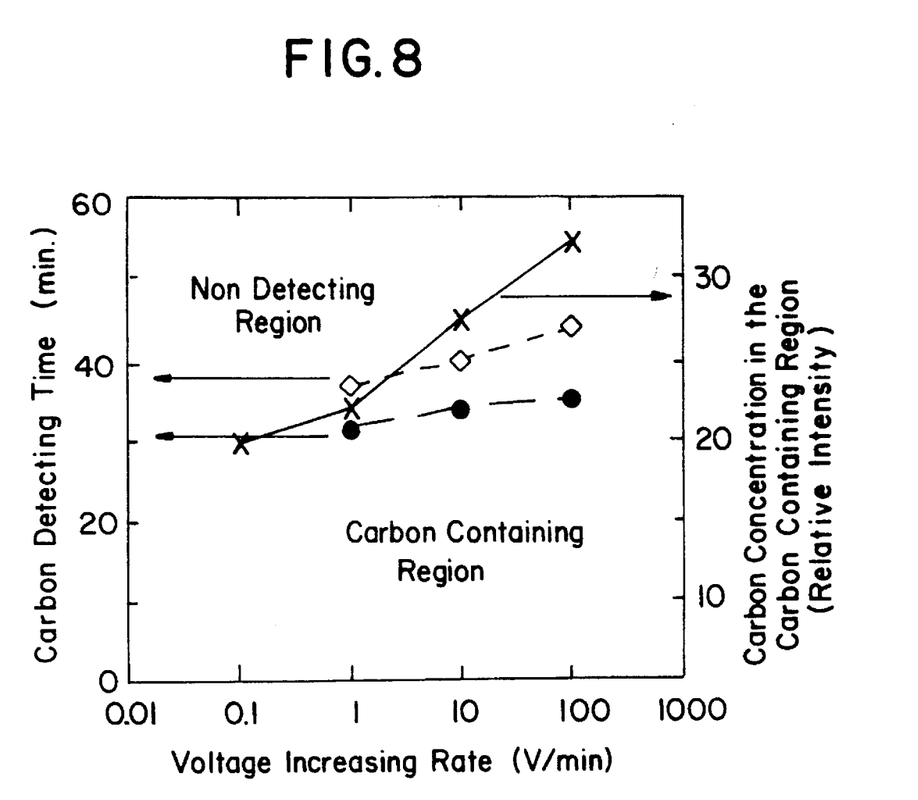
FIG. 8 is a diagram showing the depth profile for carbon obtained by AES with changing rate of increasing voltage.

The change in depth profile for carbon with varying rate of elevating the voltage is shown in FIG. 8. It can be seen that the carbon-containing region accounts for a larger area of the aluminum oxide with increasing rate of elevating the voltage.

Conclusively, the film quality of the anodically oxidized film is found to be greatly influenced by the quantity of electric current.

The present invention has been accomplished based on the findings above, and it provides an anodic oxide film of improved quality by combining the control methods described above.

Furthermore, it has been found more preferable to apply the electric current at a density in a range of 0.2 to 5 mA/cm$^2$ and at a rate of elevating the voltage in a range of 5 to 100 V/min. These conditions are greatly differed from those in a conventional process in which the electric current is applied at a density in a range of 0.01 to 0.1 mA/cm$^2$ and at a rate of elevating the voltage in a range of 0.2 to 3 V/min.

(2) Anodic Oxidation Rate

It can be seen from the foregoing that the process according to the present invention is also characterized in that an electric current is used in a larger quantity, and that, by thus increasing the current density as well as the rate of elevating the voltage, it enables an extremely rapid anodic oxidation as compared with a prior art process.

As described in the foregoing, the present invention is characterized in that the impurity content in the anodic oxide is controlled, and that the rate of anodic oxidation is increased by increasing the quantity of the electric current during the process.

The present invention is described in further detail below referring to the preferred embodiments according to the present invention. It should be understood, however, that the present invention is not to be construed as being limited to the examples below.

EXAMPLE 1

The present example refers to a case in which anodic oxidation is effected on a thin-film aluminum formed on a substrate.

A 6,000 Å thick thin-film aluminum was deposited by sputtering on a glass substrate 100 cm×100 cm in size. Tantalum, titanium, silicon, etc., can be used in the place of aluminum.

The anode of a DC power source was connected to the thin-film aluminum thus formed on the glass substrate while connecting the cathode of the same power source to a platinum cathode. The glass substrate and the cathode were placed inside an anodic oxidation solution. An ethylene glycol solution containing 3% of tartaric acid dissolved therein and neutralized with ammonia water was used as the solution for anodic oxidation. The temperature of the solution was 10° C.

Anodic oxidation was then effected by applying a current using the DC power source between the thin-film aluminum and the cathode.

The concentration of aluminum and carbon in the internal anodic oxide layer depends on the rate of elevating the voltage between the electrodes. In particular, the thickness of the internal oxide layer containing aluminum preferably accounts for 40% or less of the total thickness of the aluminum oxide layer. Accordingly, the rate of elevating the voltage, $V_{rate}$, is controlled in a range of 5 to 120 V/min, more preferably, in a range of 10 to 80 V/min. This can be further decreased to 10% or less by multiplex modulation of $V_{rate}$.

The current flow in the present example was varied in the following manner until a targeted voltage of 120 V was attained. First, the current density was maintained constant at a value of 0.05 mA/cm$^2$ for a duration of 10 minutes. The voltage during this stage was found to increase at a rate of 1 V/min. Thus, a voltage of 10 V was attained 10 minutes after the initiation of the process. Anodic oxidation was continued thereafter by increasing the current density to a magnitude of 0.5 mA/cm$^2$. During this stage, voltage was found to increase at a rate of 10 V/min. Thus, the predetermined voltage of 120 V was attained 11 minutes later.

The voltage was maintained for a duration of 15 minutes to operate the process under a constant-voltage mode. The anodic oxidation of the thin-film aluminum was completed in this manner.

Thus, a 1,600 Å thick anodic oxide film having a withstand voltage in a range of 100 to 105 V was obtained. The external anodic oxide layer (surface) was found to contain carbon at a concentration of 1% or lower. By AES, a slight formation of a mixed region of anodically oxidized aluminum and aluminum was observed in the resulting anodic oxide. However, the mixed region was hardly observed in the internal side, and the interface between the metal film and the anodic oxide was clearly observed.

The signal intensity corresponding to carbon concentration in the inner side was somewhat higher than that for the surface side. However, because carbon is blocked by the outer layer, the signal intensity was weaker as compared with that for the case in which the rate of elevating the voltage is simply increased without providing the outer layer.

The total time consumed by the process according to the present invention was greatly reduced to 36 minutes as compared with a conventional duration of 120 minutes. That is, the present invention enables rapid anodic oxidation.

It can be seen from the foregoing that the anodic oxidation process according to the present invention reduces the concentration of impurities in the anodically oxidized aluminum. Furthermore, the present invention provides a rapid process. More specifically, an anodic oxide film of a certain thickness which consumed 120 minutes for the fabrication thereof is available in 36 minutes by carrying out the process of the present invention. Moreover, the rapid process of anodic oxidation according to the present invention provides anodic oxide films improved in step coverage.

As described in the foregoing, a rapid anodic oxidation sometimes increases the carbon concentration in the surface of the oxide. Carbon atoms in the surface of the oxide originate from tartrate ions in the chemical conversion solution, and are taken up during the process of anodic oxidation. The concentration of carbon can be lowered by increasing the temperature of the solution. That is, the probability of trapping carbon atoms inside the oxide film is lowered by activating the molecular movement of carbon atoms in the solution. However, the temperature of the chemical conversion solution should not be elevated to an excessively high region, because the surface of aluminum would be roughened by the elution of aluminum oxide and the like which occurs at higher temperatures. If surface roughening occurs, the reflectance at the interface between the aluminum and aluminum oxide would be impaired. If the anodic oxide should be subjected to a laser process in the later steps of the entire process after the anodic oxidation, the thus surface-toughened aluminum would readily absorb the laser radiation to generate pinholes. It can be seen from the foregoing that the temperature of the solution of anodic oxidation should be optimally controlled.

The process of anodic oxidation according to the present invention provides high quality TFTs with a low off-current. Furthermore, a liquid crystal display panel with excellent display quality can be implemented by using the TFTs according to the present example as driver elements of the liquid crystal material.

EXAMPLE 2

Figure 9A:
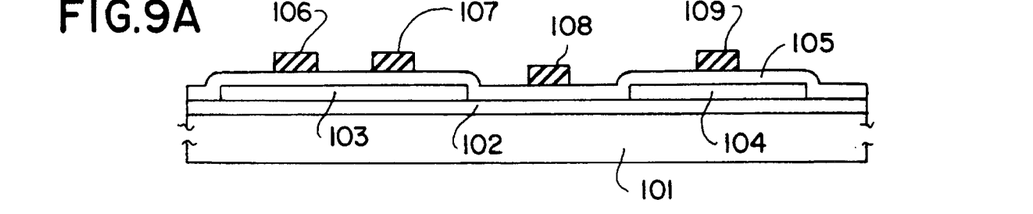
Figure 9B:
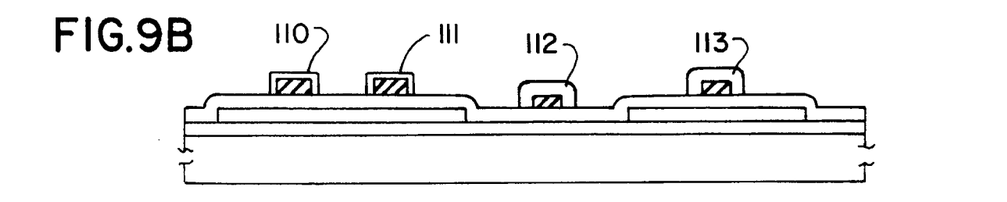
Figure 9C:
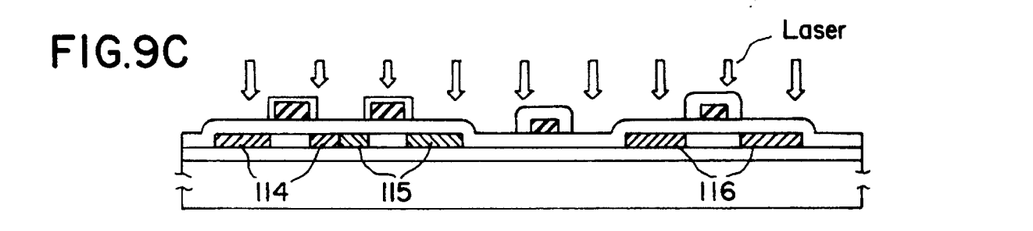
Figure 9D:
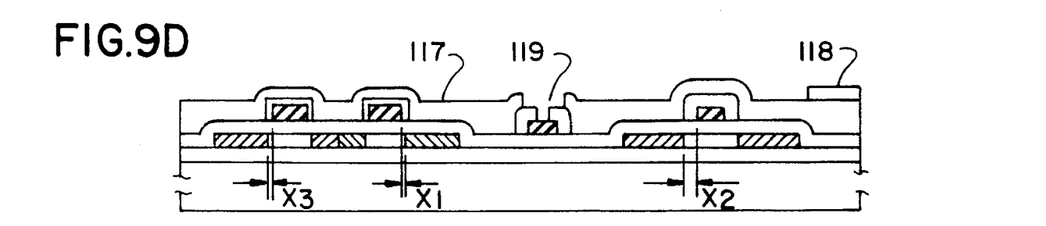
Figure 9E:
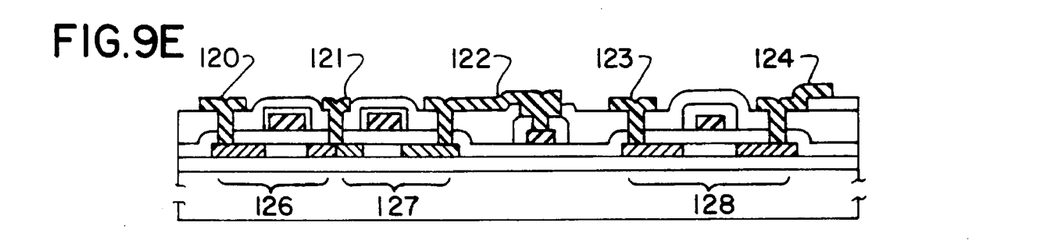
Figure 10A:
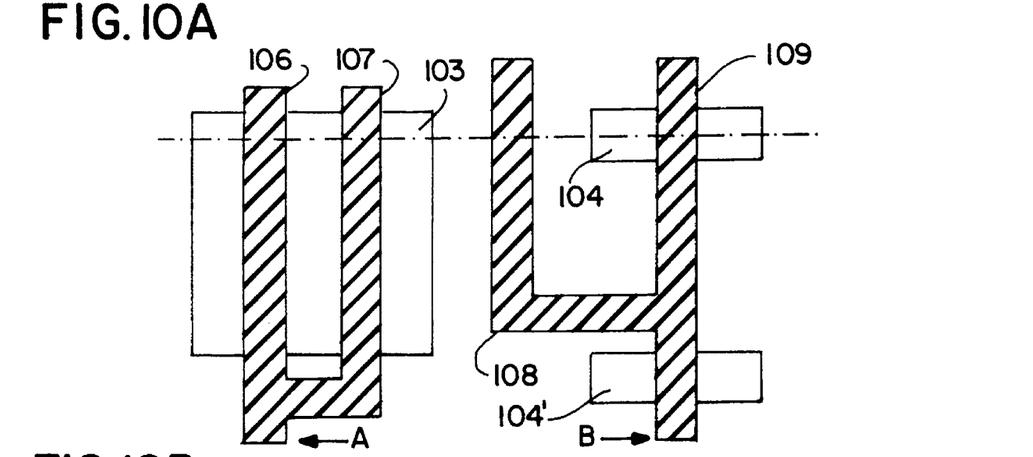
Figure 10B:
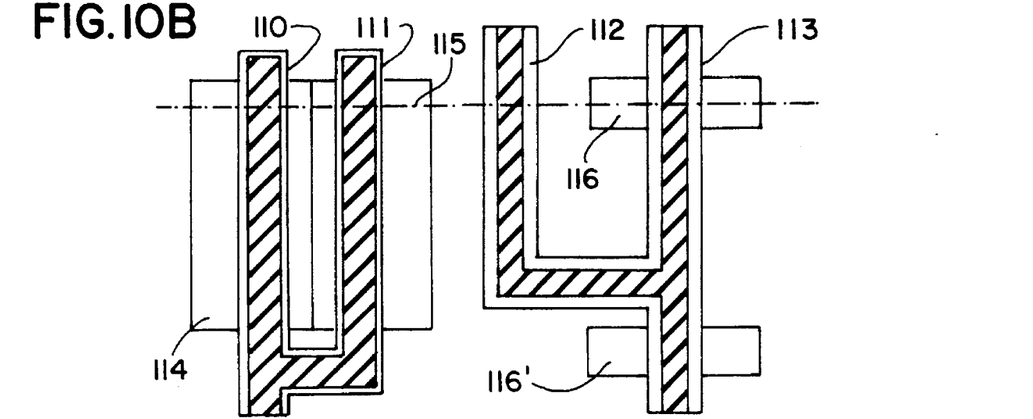

Referring to FIGS. 9 (A) to 9 (E) as well as to FIGS. 10 (A) to 10 (C), a process for fabricating an integrated circuit comprising (thin film transistors) TFTs of differing characteristics according to an embodiment of the present invention is described below. FIGS. 9 (A), 9 (C), and 9 (E) are cross sectional views taken along the dot-and-dash lines provided in FIGS. 10 (A) to 10 (C), respectively.

A silicon oxide film 102 from 1,000 to 3,000 Å in thickness was deposited by sputtering on a Corning 7059 substrate 101 having a size of 300 mm×300 mm or 100 mm×100 mm. The silicon oxide film may be deposited alternatively by plasma CVD.

Then, an amorphous silicon film was deposited by plasma CVD or LPCVD to a thickness of 300 to 1,500 Å, preferably, 500 to 1,000 Å. The resulting amorphous silicon film was patterned to form island-like regions 103 and 104. Then, a silicon oxide film was deposited by sputtering or plasma CVD to a thickness of 200 to 1,500 Å, preferably, 500 to 1,000 Å. This silicon oxide film must be deposited carefully because it functions as a gate insulating film. In the case of depositing the film by plasma CVD, for example, TEOS (tetraethoxysilane) is used as the starting material, and TEOS is subjected to RF discharge together with oxygen while maintaining the substrate in a temperature range of 150° to 400° C., preferably at 200° to 250° C. TEOS and oxygen were mixed at a pressure ratio of 1:1 to 1:3, while maintaining the total pressure at 0.05 to 0.5 Torr and the RF power of 100 to 250 W. In the alternative, the silicon oxide film can be deposited by reduced pressure CVD or CVD while maintaining the substrate in a temperature range of 150° to 400° C., preferably, in a range of 200° to 250° C. using TEOS in combination with gaseous ozone.

The silicon region 103 alone was crystallized thereafter by irradiating a laser beam using a KrF excimer laser operated at a wavelength of 248 nm and a pulse width of 20 nsec. The laser was operated at an energy density of 200 to 400 mJ/cm$^2$, preferably, 250 to 300 mJ/cm$^2$. During this step of laser-beam irradiation, the substrate was heated to 300° to 500° C. The laser for use in the annealing need not always be a KrF excimer laser, and other types of excimer lasers, such as an XeCl laser emitting light having a wavelength of 308 nm, may be used as well. After the process, the silicon region 104 was still amorphous.

An aluminum film 2,000 Å to 5 μm thick, for instance, 6,000 Å thick, was deposited thereafter by electron beam vapor deposition. The resulting aluminum film was patterned to obtain gate electrodes 106, 107, 109, and an interconnection 108. Aluminum doped with scandium (Sc) at a concentration of 0.05 to 0.3% by weight was used to suppress the formation of hillocks upon heating. The resulting structure is shown in FIGS. 9 (A) and 10 (A). Referring to FIG. 10 (A), the gate electrode 109 is electrically connected with the interconnection 108, but the gate electrodes 106 and 107 are isolated from the gate electrode 109 and the interconnection 108. Hereinafter, the former sequence is denoted A-sequence, and the latter sequence is denoted B-sequence.

The substrate was then immersed into an ethylene glycol solution containing 1 to 3% of tartaric acid and being neutralized with ammonia water to yield a pH value of about 7. Anodic oxidation was conducted thereafter by using the aluminum gate electrode as the anode and a platinum as the cathode. The temperature of the anodic oxidation solution was kept at 10° C.

Anodic oxidation was effected by separately preparing two types of independently controllable power source terminals as anodes and the A-sequence and B sequence were connected to separate terminals, respectively. Then, current was applied to both A- and B-sequence until a first voltage $V_1$ was achieved, and the voltage $V_1$ was maintained for 1 hour. The A-sequence was then maintained at the voltage $V_1$ while applying current to the B-sequence so that a second elevated voltage $V_2$ was attained. By thus conducting the anodic oxidation in two steps, anodic oxides differing in thickness can be obtained on the sides and upper surfaces of the gates of the A- and B-sequence. That is, a thicker film of anodic oxide is obtained for the latter sequence. Preferably, $V_1$ is set at a value in a range of 50 to 150 V, specifically in this case, it was set at 100 V. $V_2$ is preferably in a range of 100 to 250 V, for example, 200 V. Optimal rate of elevating the voltage in the present example is in a range of 20 to 50 V/min. $V_1$ is set lower than $V_2$.

As a result, about 1,200 Å thick anodic oxide coating 110 and 111 was obtained on the gate electrodes 106 and 107 of the A-sequence, and 2,400 Å thick anodic oxide coating 112 and 113 was obtained on the gate electrode 109 and the interconnection 108 of the B-sequence (FIG. 9 (B)).

Impurity ions (phosphorus and boron ions) were implanted into the island-like silicon films of each of the TFTs by means of ion doping (also called as plasma doping) according to known CMOS technology and self-aligned impurity implantation technology. In the present example, phosphine (PH$_3$) and diborane (B$_2$H$_6$) were used as the doping gases. The dose of the impurities was $2\times10^{15}$ to $8\times10^{15}$ cm$^{-2}$. Thus were obtained N-type impurity (phosphorus) regions 114 and 116, and a P-type impurity (boron) region 115 to finally obtain NTFTs 126 and 128, and a PTFT 127.

The crystallinity of the portions whose crystallinity was impaired by the impurity implantation was recovered by irradiating a laser radiation using a KrF laser operated at a wavelength of 248 nm and at a pulse width of 20 nsec. The laser was operated at an energy density of from 150 to 400 mJ/cm$^2$, preferably, from 200 to 250 mJ/cm$^2$. The N-type impurity regions 114 and 116, and the P-type impurity region 115 were activated in this manner. The sheet resistance of the regions were found to be in a range of from 200 to 800 Ω/square. The present step can be effected otherwise by means of rapid thermal annealing (RTA) (FIGS. 9 (C) and 10 (B)).

The width of the offset region (high resistance region) of each of the TFTs was thus determined. More specifically, since the anodic oxides 110 and 111 are formed at a thickness of about 1,200 Å, and the scattering of the impurities occurs during ion doping, the offset widths $x_1$ and $x_3$ for the two TFTs in the left hand side of FIG. 9 are both determined to be about 1,000 Å. For the TFT in the right hand side of the same figure, the offset width $x_2$ is about 2,000 Å considering that the thickness of the anodic oxide 113 is about 2,400 Å (FIG. 9 (D)).

The offset widths $x_1$ and $x_3$ of the TFTs 126 and 127 for high frequency operation must be less than the offset width $x_2$ of the NTFT 128 in which a low off-current is required. However, NTFT is more likely to undergo degradation due to the hot carriers when the drain is subjected to a reverse biased condition. Accordingly, the offset width $x_3$ of the NTFT is preferably set larger than the width $x_1$ of the PTFT. Because the NTFT 128 should be a lower off-current and because high drain current is applied thereto, the offset width $x_2$ should be large, and larger than $x_3$.

Figure 10C:
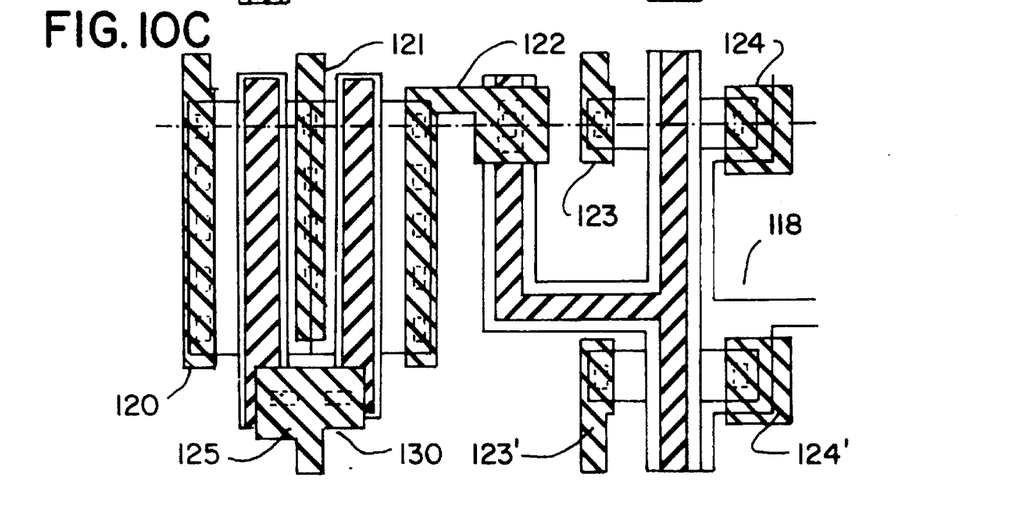

The gate and the interconnection (enumerated 130 in FIG. 10 (C)) were each cut to a length necessary for the circuit. A silicon oxide film was then deposited as an interlayer dielectric 117 to a thickness of 3,000 to 10,000 Å, for instance, 6,000 Å, by plasma CVD using TEOS as the starting material together with oxygen, or by reduced pressure CVD or normal pressure CVD using TEOS in combination with ozone. The film deposition can be effected with improved step coverage by incorporating fluorine inside the silicon oxide film. This can be realized by allowing dicarbon hexafluoride ($C_2H_6$) be added to the reactive gas during the deposition. The substrate was maintained at a temperature in a range of 150° to 400° C., preferably 200° to 300° C. An ITO coating was deposited thereafter by sputtering, and was patterned to provide a pixel electrode 118. A contact hole 119 was formed by etching the interlayer dielectric 117 and the anodic oxide 112 of the interconnection 108 (FIG. 10 (D)).

The interlayer dielectric and the gate insulating film 105 were etched thereafter to form contact holes on the source/drain of the TFT. Although not shown in FIG. 1, the anodic oxides 110 and 111 were etched at the same time with the formation of the contact holes to provide contact holes for the gate electrodes 106 and 107 (FIG. 10 (C)).

Interconnections 120 to 125 made of a multilayered film of titanium nitride and aluminum were formed. The interconnection 124 was connected to the pixel electrode 118. The gate electrodes 106 and 107 were connected to the interconnection 125 via the contact holes formed in the previous step. The resulting structure was annealed in hydrogen in a temperature range of 200° to 300° C. for a duration of 0.1 to 2 hours to complete the hydrogenation of silicon. An integrated circuit was finally obtained in this manner (FIGS. 9 (E) and 10 (C)).

In the present example, the step of forming the contact hole by etching the thick anodic oxide 113 was conducted separately from the step of forming other contact holes. As a matter of course, the two steps can be effected simultaneously. However, the two-step process above is employed in the present example in the expense of mass productivity because the contact hole in the anodic oxide 113 requires etching for an additional depth corresponding to the thickness difference of the anodic oxide, i.e., 1,200 Å, as compared with those in the other portions. Moreover, the etching rate for a barrier-type anodic oxide obtained in the present example is considerably lower as compared with those for silicon oxide and the like. Thus, if both of the contact holes were to be etched simultaneously, the contact holes to the source and drain would be formed excessively deep as to perforate the source and drain.

TFTs having differing characteristics were formed on a single substrate in this manner. That is, referring to FIGS. 9 (E) and 10 (C), two TFTs 126 and 127 located on the left hand side of the figures comprise crystalline silicon as the active layer and a narrower high resistance region (offset region), and are suitable for high speed operation. On the other hand, a TFT 128 fabricated on the right hand side of the figures comprise an amorphous silicon active layer and a wider high resistance region (offset region), and is characterized by its low leak-current. The active layer of the TFT 128 may be replaced by an active layer made from a crystalline silicon having a lower crystallinity than those used in the TFTs 127 and 128. The former TFTs are used for a driver circuit, and the latter TFT is used for an active matrix circuit in a monolithic active matrix device.

Degradation due to hot carriers is observed to occur frequently on NTFTs, however, driver TFTs having a large channel width ($x_4$) are rarely found to suffer this type of degradation. In the NTFTs designed for high speed operation in decoder circuits, and particularly shift registers, CPUs (central processing units), memories, and other compensation circuits, it is necessary to establish a channel with a small width ($x_3$) and a short length. Accordingly, these NTFTs undergo less degradation because the drain voltage of these NTFTs is lower than that of a TFT 128 of an active matrix circuit having an offset width of $x_2$. Thus, the offset widths $x_4$, $x_3$, $x_2$ must increase in this order. In case of a PTFT, however, the channel length $x_1$ thereof is allowed to be the same as $x_4$ or less, because there is hardly any degradation when used in any manner inclusive of a case using it as a driver circuit and in other auxiliary circuits.

Thus, as described in the foregoing, the present example provides a favorable TFT having low off-current. Furthermore, a liquid crystal display panel with excellent display quality can be implemented by using the TFTs according to the present example as driver elements of the liquid crystal material.

EXAMPLE 3

Referring to FIGS. 11 (A) to 11 (D), a process for fabricating a reversed stagger-type insulated gate thin film transistors (TFTs) according to another embodiment of the present invention is described below.

Figure 11A:
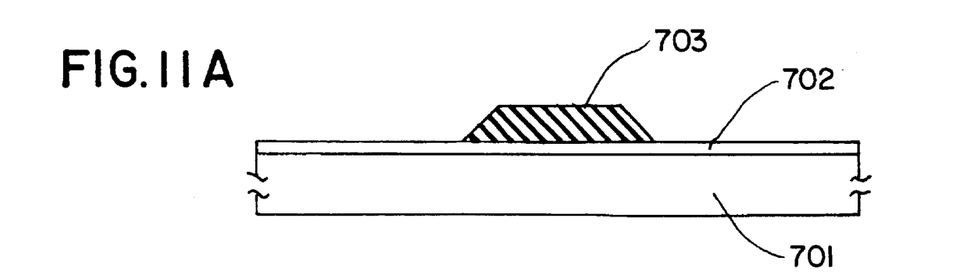

A silicon nitride film from 1,000 to 3,000 Å in thickness, for instance, at a thickness of 2,000 Å, was deposited as a base film 702 by sputtering on a Corning 7059 substrate 701 of 300 mm×400 mm or 100 mm×100 mm. Instead of forming a silicon nitride film, a silicon oxide film may be formed at about the same thickness as that of the silicon nitride film. In case of depositing a silicon film, sputtering under gaseous oxygen is employed. For mass production, the film may be otherwise deposited by decomposing TEOS using plasma CVD.

An aluminum film from 1,000 Å to 2 μm in thickness, for instance, a 2,800 Å thick aluminum film containing 1% by weight of silicon or from 0.1 to 0.3% by weight of scandium was deposited thereafter by electron beam vapor deposition or by sputtering.

The resulting aluminum film was subjected to photo etching in a wet process using a mixed solution of phosphoric acid, nitric acid, and acetic acid. Thus was obtained a gate electrode portion 703 having a tapered cross section by patterning (FIG. 11 (A)).

Figure 11B:
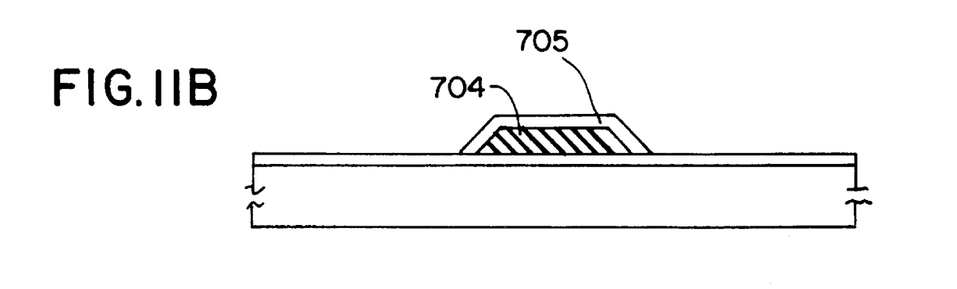

The gate electrode portion 703 was then subjected to anodic oxidation. In the present example, an ethylene glycol solution containing 3% of tartaric acid and being neutralized with ammonia water to a pH value of about 7 was used as the anodic oxidation solution. The anodic oxidation process comprises continuously increasing the current density in a range of from 0.05 to 5 mA/cm$^2$ at a rate of 0.0165 mA/cm$^2$ per second to thereby change the rate of elevating voltage from 1 V/min to 100 V/min, and at the point of attaining a voltage of 100 V one minute after the initiation of the process, the voltage was maintained for a duration of 30 minutes. An anodically oxidized aluminum 705 was obtained at a thickness of about 1,400 Å. Thus was obtained an aluminum gate electrode 704 and an anodically oxidized aluminum thereon as a gate insulating film 705 (FIG. 8(B)).

Preferably, the resulting structure is heated in air at a temperature in a range of 200° to 300° C., for instance, at 200° C., for a duration of from several to several tens of minutes, because the leak current in the anodically oxidized aluminum can be reduced by a digit or more.

Next, a silicon nitride film is deposited as a second gate insulating film 706 to a thickness of 1,000 to 3,000 Å, for example, 2000 Å, by plasma CVD using a mixture of silane and ammonia at a mixture ratio of 1:3–1:8, for example, 1:5.

Instead of forming the silicon nitride film, a silicon oxide film of 1000–3000 Å thick may be formed. In case of depositing a silicon oxide film, either sputtering or plasma CVD is effected. Plasma CVD can be effected by using TEOS as a starting material together with oxygen, and applying RF energy to the starting gas to pyrolyze and deposit silicon oxide on the substrate maintained at a temperature of 150° to 400° C., preferably, 200° to 250° C. The TEOS and oxygen are mixed at a pressure ratio of 1:1 to 1:10 and at a total pressure of 0.05–0.5 Torr, and RF discharge is applied at an RF power of from 100 to 250 W. In the alternative, the silicon oxide film can be formed by reduced pressure CVD or normal pressure CVD using TEOS in combination with ozone, while heating the substrate at 150°–400° C., preferably, at 200°–250° C.

The gate insulating film 706 may be omitted. However, short circuit between the electrodes can be suppressed and mutual conductance of the TFT can be improved by the provision of the second insulator 706.

Figure 11C:
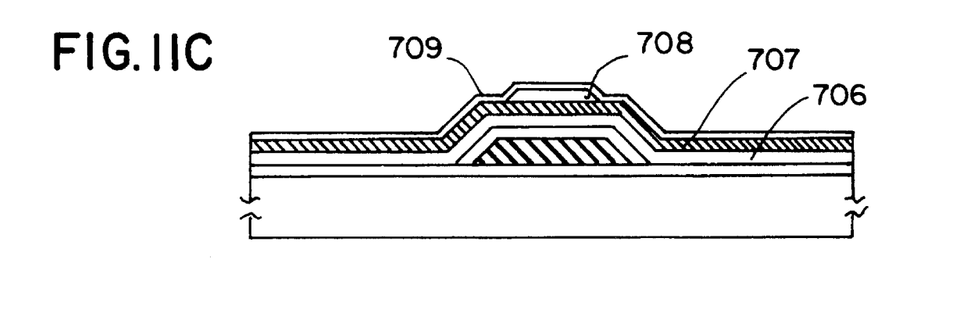

Next, an I-type amorphous silicon film 707 is deposited on the gate insulating film 706 thereafter to a thickness of 200–2000 Å, for example, 1000 Å to provide a channel region.

A silicon nitride film is further deposited thereon to a thickness of 500–3000 Å, for example, 1000 Å. The thus formed silicon nitride film is etched to provide a protective film 708 by using a hydrofluoric acid diluted with pure water to a concentration with HF/water ratio being 1/10 to 1/50.

An n+ amorphous silicon film 709 containing phosphorus is deposited thereon by plasma CVD to a thickness of 200 to 1,000 Å, for example, 300 Å (FIG. 11C).

Figure 11D:
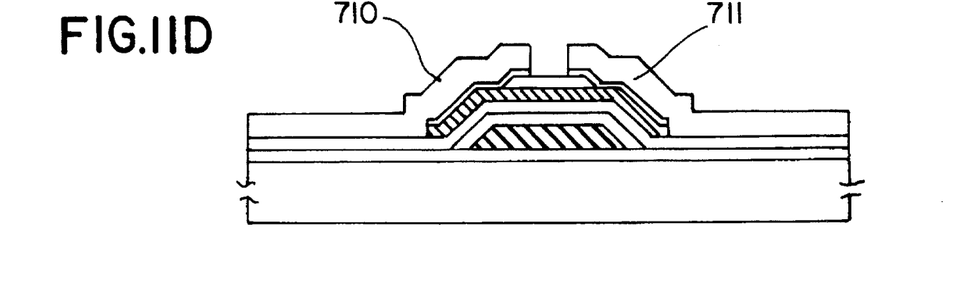

The I-type amorphous silicon film 707 and the n+ amorphous silicon film 709 were patterned thereafter by subjecting them to dry etching. An aluminum film was formed thereon by electron beam vapor deposition or by sputtering to a thickness in a range of 1,000 Å to 2 μm, for instance, at a thickness of 300 Å in this case. The aluminum film and the underlying n+ amorphous silicon film were etched and patterned by subjecting them to dry etching. Thus were obtained a source electrode 710 and a drain electrode 711, and the underlying n+ amorphous silicon film was divided into source and drain regions. A complete TFT was obtained in this manner (FIG. 11 (D)).

Thus, as described in the foregoing, the present example provides a favorable TFT having low off-current. Furthermore, a liquid crystal display panel with excellent display quality can be implemented by using the TFTs according to the present example as driver elements of the liquid crystal material.

As described in the foregoing, the present invention provides an anodic oxide whose impurity concentration is considerably lowered. Thus, by applying the anodic oxide film of the present invention to the gate of an insulated gate thin film transistor (TFT), parasitic capacitance as well as off-current can be reduced, and the cause for characteristics shift can be removed.

Furthermore, an MIM (metal-insulator-metal) diode improved in dynamic range and in frequency characteristics can be implemented by employing the process according to the present invention.

The present invention greatly saves time for the process of anodic oxidation. The prior art process of anodic oxidation which consumed an extremely long time can be shortened, and hence, a process suitable for mass production is provided.

In the present invention, there was described mainly by referring specifically to a case for aluminum (Al) and aluminum oxide ($Al_2O_3$) obtained by anodically oxidizing aluminum. However, the present invention is not only limited thereto, and is applicable to, for instance, tantalum (Ta) and tantalum oxide ($Ta_2O_3$), titanium (Ti) and titanium oxide ($TiO_2$), and silicon (Si) and ($SiO_2$), as well as to multilayered films thereof.

While the invention has been described in detail and with reference to specific embodiments thereof, it will be apparent to one skilled in the art that various changes and modifications can be made therein without departing from the spirit and scope thereof.

What is claimed is:

1. A process of anodic oxidation comprising the steps of:
   applying a voltage between a thin film comprising an anodizable material and a cathode through an electrolyte therebetween, with said thin film used as an anode;
   increasing monotonically a current applied between the thin film and the cathode until the voltage therebetween reaches a first value; and then
   maintaining said first voltage for a first duration.

2. The process of claim 1 wherein said current is increased in a stepwise manner.

3. The process of claim 1 wherein said current is increased at a constant rate.

4. The process of claim 1 wherein said thin film is used as an electrode in a semiconductor device.

5. The process of claim 1 wherein said anodizable material comprises a material selected from the group consisting of aluminum, tantalum, titanium, and silicon.

6. The process of claim 1 wherein said current is increased in order to prevent formation of a mixed region including both said anodizable material and anodic oxide.

7. An anodic oxidation process for oxidizing a surface of an anodizable material comprising the steps of:
   applying a voltage between said anodizable material and a cathode in an electrolyte, with said anodizable material used as an anode;
   anodizing the surface of said anodizable material by increasing the voltage between said anodizable material and said cathode until said voltage reaches a first magnitude while keeping an applied current at a first constant value; and then increasing the voltage between said anodizable material and the cathode subsequently after said voltage reaches said first magnitude while keeping the applied current at a second constant value, said first value being different from said second value, wherein an increasing rate of said voltage is increased during said oxidation.

8. The process of claim 7 wherein said anodizable material is used as an electrode in a semiconductor device.

9. The process of claim 7 wherein said anodizable material comprises a material selected from the group consisting of aluminum, tantalum, titanium, and silicon.

10. The process of claim 7 wherein said increasing rate is increased in order to prevent formation of a mixed region including both said andoizable material and anodic oxide.

* * * * *